United States Patent
Sim et al.

(10) Patent No.: US 10,250,277 B1
(45) Date of Patent: Apr. 2, 2019

(54) SAR-TYPE ANALOG-DIGITAL CONVERTER USING RESIDUE INTEGRATION

(71) Applicant: POSTECH ACADEMY-INDUSTRY FOUNDATION, Pohang-si (KR)

(72) Inventors: Jae Yoon Sim, Pohang-si (KR); Seungnam Choi, Hwasung-si (KR)

(73) Assignee: POSTECH ACADEMY-INDUSTRY FOUNDATION, Pohang-si (KR)

(*) Notice: Subject to any disclaimer, the term of this patent is extended or adjusted under 35 U.S.C. 154(b) by 0 days.

(21) Appl. No.: 15/993,432

(22) Filed: May 30, 2018

(30) Foreign Application Priority Data

Sep. 27, 2017 (KR) .......................... 10-2017-0124868

(51) Int. Cl.
| | | |
|---|---|---|
| *H03M 1/14* | (2006.01) | |
| *H03M 1/16* | (2006.01) | |
| *H03M 1/38* | (2006.01) | |
| *H03M 3/00* | (2006.01) | |

(52) U.S. Cl.
CPC ............ *H03M 3/46* (2013.01); *H03M 3/464* (2013.01); *H03M 1/145* (2013.01); *H03M 1/164* (2013.01); *H03M 1/38* (2013.01)

(58) Field of Classification Search
CPC ........ H03M 3/46; H03M 3/464; H03M 1/145; H03M 1/38; H03M 1/164
USPC .......................... 341/143, 156, 161–163, 172
See application file for complete search history.

(56) References Cited

U.S. PATENT DOCUMENTS

| | | | | |
|---|---|---|---|---|
| 7,511,648 B2 * | 3/2009 | Trifonov | ............... | H03M 1/145 341/118 |
| 7,944,386 B2 * | 5/2011 | Hurrell | ................. | H03M 1/145 341/143 |
| 2012/0229313 A1 | 9/2012 | Sin et al. | | |

FOREIGN PATENT DOCUMENTS

| | | |
|---|---|---|
| KR | 2010-0031831 A | 3/2010 |
| KR | 2012-0061094 A | 6/2012 |
| KR | 2012-0065806 A | 6/2012 |
| KR | 10-1309837 B1 | 9/2013 |
| KR | 2015-0122284 A | 11/2015 |
| KR | 2017-0069140 A | 6/2017 |
| KR | 10-1774522 B1 | 9/2017 |

* cited by examiner

*Primary Examiner* — Khai M Nguyen
(74) *Attorney, Agent, or Firm* — Morgan, Lewis & Bockius LLP

(57) ABSTRACT

The present invention relates to a successive approximation register (SAR)-type analog-digital converter (ADC), which can amplify a residual voltage without a non-linearity problem caused by an output voltage of a residual voltage amplifier, thereby performing high-resolution analog-digital conversion at low power consumption.

The SAR-type ADC may include: a coarse/fine SAR conversion unit configured to receive an analog input voltage and convert the received voltage into an MSB digital signal in a coarse SAR conversion mode, and receive a feedback voltage and convert the received voltage into an LSB digital signal in a fine SAR conversion mode; and a residue integration unit configured to repeatedly amplify a residual voltage with a predetermined gain by a predetermined number of times and output the amplified voltage as a final target multiple, the residual voltage corresponding to a voltage difference between the analog input voltage and an analog voltage obtained by converting the digital signal into an analog signal.

13 Claims, 8 Drawing Sheets

SAR-TYPE ANALOG-DIGITAL CONVERTER USING RESIDUE INTEGRATION

BACKGROUND

1. Technical Field

The present disclosure relates to a successive approximation register (SAR)-type analog-digital converter (ADC) using residue integration, and more particularly, to an SAR-type ADC using residue integration, which can amplify a residual voltage without a non-linearity problem caused by an output voltage of a residual voltage amplifier, thereby performing high-resolution analog-digital conversion at low power consumption.

2. Related Art

An analog-digital converter (ADC) is a device that samples an analog signal and converts the sampled analog signal into a digital code or digital signal. Examples of the ADC may include a successive approximation register (SAR)-type ADC which includes an SAR to combine a digital code while sequentially increasing or decreasing the digital code from the most significant bit (MSB), and approximates the combined result to an analog input signal by comparing the combined result to the analog input signal. For this operation, the SAR-type ADC includes an N-bit digital-analog converter (DAC) and a comparator.

The SAR-type ADC has better energy efficiency than a general ADC. For this reason, the SAR-type ADC is widely applied to various sensor circuits.

However, there are difficulties in implementing a high-resolution ADC due to noise of the comparator applied to the SAR-type ADC. Furthermore, the various sensor circuits need to accurately sense an analog signal while lowering power consumption.

Therefore, the SAR-type ADC applied to the various sensor circuits is required to perform high-resolution analog-digital conversion with low power consumption.

SUMMARY

Various embodiments are directed to a SAR-type ADC using residue integration, which can amplify a residual voltage without a non-linearity problem caused by an output voltage of a residual voltage amplifier, thereby performing high-resolution analog-digital conversion at low power consumption.

In an embodiment, a SAR-type ADC using residue integration may include: a coarse/fine SAR conversion unit configured to receive an analog input voltage and convert the received voltage into an MSB digital signal in a coarse SAR conversion mode, and receive a feedback voltage and convert the received voltage into an LSB digital signal in a fine SAR conversion mode; a residue integration unit configured to repeatedly amplify a residual voltage with a predetermined gain by a predetermined number of times and output the amplified voltage as a final target multiple, the residual voltage corresponding to a voltage difference between the analog input voltage and an analog voltage obtained by converting the digital signal into an analog signal; and a digital signal output unit configured to add up a coarse SAR conversion result supplied from the coarse/fine SAR conversion unit, a result of a delta-signal modulation (DSM) loop installed in the residue integration unit, and a fine SAR conversion result supplied from the coarse/fine SAR conversion unit, and output a digital code of the corresponding bit.

DETAILED DESCRIPTION

Hereafter, exemplary embodiments will be described below in detail with reference to the accompanying drawings.

Figure 1:
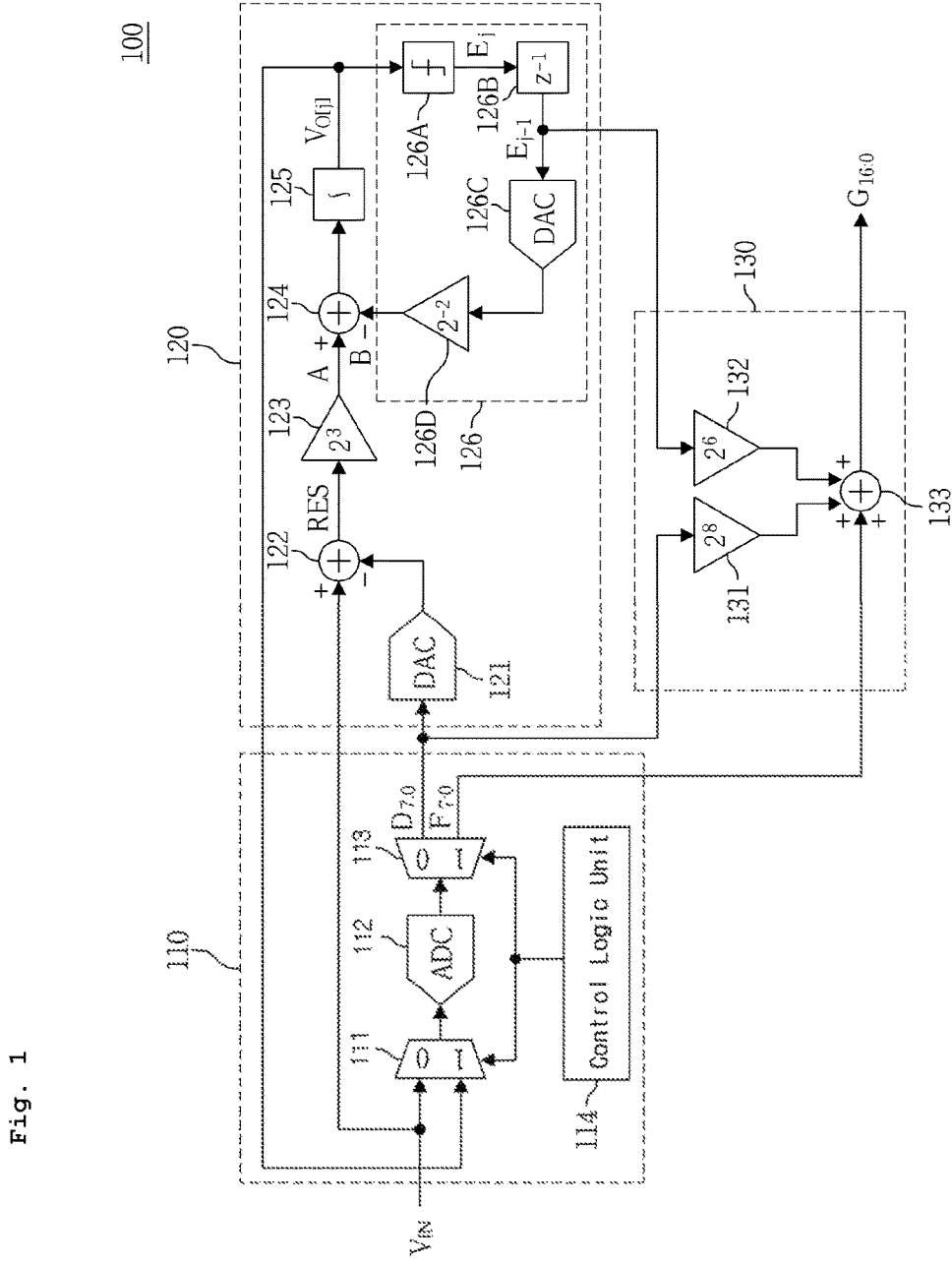
FIG. 1 is a block diagram illustrating an SAR-type ADC using a residual voltage amplifier according to an embodiment of the present invention.

FIG. 1 is a block diagram illustrating an SAR-type ADC using a residual voltage amplifier according to an embodiment of the present invention. As illustrated in FIG. 1, the SAR-type ADC 100 includes a coarse/fine SAR conversion unit 110, a residue integration unit 120 and a digital signal output unit 130.

The coarse/fine SAR conversion unit 110 receives an analog input voltage $V_{IN}$ and converts the received voltage into a most-significant-bit digital signal (MSBs) (for example, $D_{7:0}$) in a coarse SAR conversion mode. The coarse/fine SAR conversion unit 110 receives a final residual voltage $V_{O[32]}$ as a feedback voltage and converts the received voltage into a least-significant-bit digital signal (LSBs) (for example, $F_{7:0}$) in a fine SAR conversion mode. Therefore, the digital signal $F_{7:0}$ correspond to a digital signal obtained by converting an output voltage value which is acquired after residual voltage amplification is finally repeated.

For this operation, the coarse/fine SAR conversion unit 110 includes a multiplexer 111, an ADC 112, a demultiplexer 113 and a control logic unit 114.

The multiplexer 111 selects and outputs the analog input voltage $V_{IN}$ in the coarse SAR conversion mode according to control of the control logic unit 114, and selects and outputs a feedback output voltage $V_{O[j]}$ in the fine SAR conversion mode.

The ADC 112 converts the analog signal (voltage) supplied from the multiplexer 111 into a digital signal in the coarse or fine SAR conversion mode. Since the ADC 112 is shared to perform analog-digital conversion in the coarse SAR conversion mode and the fine SAR conversion mode, the area and power consumption of the SAR-type ADC 100 can be reduced.

The demultiplexer 113 outputs the digital signal supplied from the ADC 112. At this time, the demultiplexer 113 outputs the MSB digital signal (MSBs) (for example, $D_{7:0}$) in the coarse SAR conversion mode, or outputs the LSB digital signal (LSBs) (for example, $F_{7:0}$) in the fine SAR conversion mode, according to control of the control logic unit 114.

The control logic unit 114 controls the operations of the multiplexer 111 and the demultiplexer 113 according to the coarse SAR conversion mode and the fine SAR conversion mode.

The residue integration unit 120 performs a residue integration process of repeatedly amplifying a residual voltage RES with a predetermined gain by a predetermined number of times and outputting the amplified voltage as the final target multiple, the residual voltage RES corresponding to a voltage difference between the analog input voltage $V_{IN}$ and an analog voltage obtained by converting the digital signal $D_{7:0}$ into an analog signal. For example, the residue integration unit 120 repeatedly amplifies the residual voltage RES with a gain of $2^3$ by $2^5$ times, and finally outputs a voltage $2^8$ times higher than the residual voltage RES. At this time, since the residue integration unit 120 limits an output voltage of an internal integrator within an output voltage range (OVR) which does not cause non-linearity of an internal amplifier, a non-linearity problem caused by an increase in output voltage of the internal integrator can be prevented.

For this operation, the residue integration unit 120 includes a first digital-analog converter (DAC) 121, a first subtractor 122, a residual voltage amplifier 123, a second subtractor 124, an integrator 125 and a delta-sigma modulation (DSM) loop 126.

The first DAC 121 converts the MSB digital signal $D_{7:0}$ supplied from the demultiplexer 113 into an analog signal.

The first subtractor 122 subtracts an output voltage of the first DAC 121 from the input voltage $V_{IN}$, and outputs the residual voltage RES.

The residual voltage amplifier 123 amplifies the residual voltage RES supplied from the first subtractor 122 with a predetermined multiple (for example, $2^3$).

The second subtractor 124 subtracts a DSM feedback voltage B supplied through the DSM loop 126 from the output voltage A of the residual voltage amplifier 123. The default value of the DSM feedback voltage B is zero.

The integrator 125 generates an output voltage $V_{o[5]}$ by integrating an output voltage of the second subtractor 124.

Whenever the residual voltage RES is amplified with a gain of $2^3$ and accumulated in the integrator 125 ($2^5$ times), the DSM loop 126 generates the DSM feedback voltage B and supplies the DSM feedback voltage B to the second subtractor 124. Thus, since the DSM feedback voltage B is subtracted from the output voltage A of the residual voltage amplifier 123 through the second subtractor 124 whenever the residual voltage RES is integrated through the above-described path, the output voltage $V_{o[j]}$ of the integrator 125 is limited within the output voltage range which does not cause non-linearity of the residual voltage amplifier 123.

For this operation, the DSM loop 126 includes a comparator 126A, a delay 126B, a second DAC 126C and an amplifier 126D.

The comparator 126A generates a feedback voltage $E_i$ by comparing the output voltage $V_{o[j]}$ of the integrator 125 to a reference voltage. The comparator 126A may be implemented with a 1-bit comparator.

The delay 126B delays the feedback voltage $E_i$ supplied from the comparator 126A by a preset time. The preset time indicates a time corresponding to one round of the feedback loop. The feedback loop indicates a loop composed of the second subtractor 124, the integrator 125 and the DSM loop 126.

The second digital-analog converter 126C converts the digital feedback voltage $E_{i-1}$ delayed by the delay 126B into an analog signal. The second DAC 126C may be implemented with a 1-bit DAC.

The amplifier 126D generates the DSM feedback voltage B by amplifying the analog voltage supplied from the second DAC 126C with a predetermined multiple (for example: $2^{-2}$).

The output voltage ($V_{O[j]}=V_O[2^5]$) amplified $2^8$ times by the residue integration unit 120 is transferred to the coarse/fine SAR conversion unit 110. Then, the output voltage is transferred to the ADC 112 and subjected to fine SAR conversion, according to control of the control logic unit 114. That is, the output voltage ($V_{O[j]}=V_O[2^5]$) is subjected to fine SAR conversion by the coarse/fine SAR conversion unit 110, and converted into the LSB digital signal (LSBs) (for example, $F_{7:0}$).

The digital signal output unit 130 serves to adjust the coefficient of a digital output $G_{16:0}$ of the SAR-type ADC 100 to a target coefficient. For this operation, the digital signal output unit 130 includes amplifiers 131 and 132 and an adder 133.

The amplifier 131 amplifies the digital signal $D_{7:0}$ supplied from the demultiplexer 113 with a predetermined multiple (for example, $2^8$).

The amplifier 132 amplifies DSM results $E_0$ to $E_{31}$ supplied from the DSM loop 126 with the predetermined multiple (for example, $2^6$).

The adder 133 generates the digital output $G_{16:0}$ by adding up the output voltages of the amplifiers 131 and 132 and the LSB digital signal $F_{7:0}$ supplied from the demultiplexer 113. The adder 133 adds up the result $D_{7:0}$ of the coarse SAR conversion, the results $E_0$ to $E_{31}$ of the DSM loop, and the result $F_{7:0}$ of the fine SAR conversion, and finally outputs the 17-bit digital code $G_{16:0}$.

Figure 2:
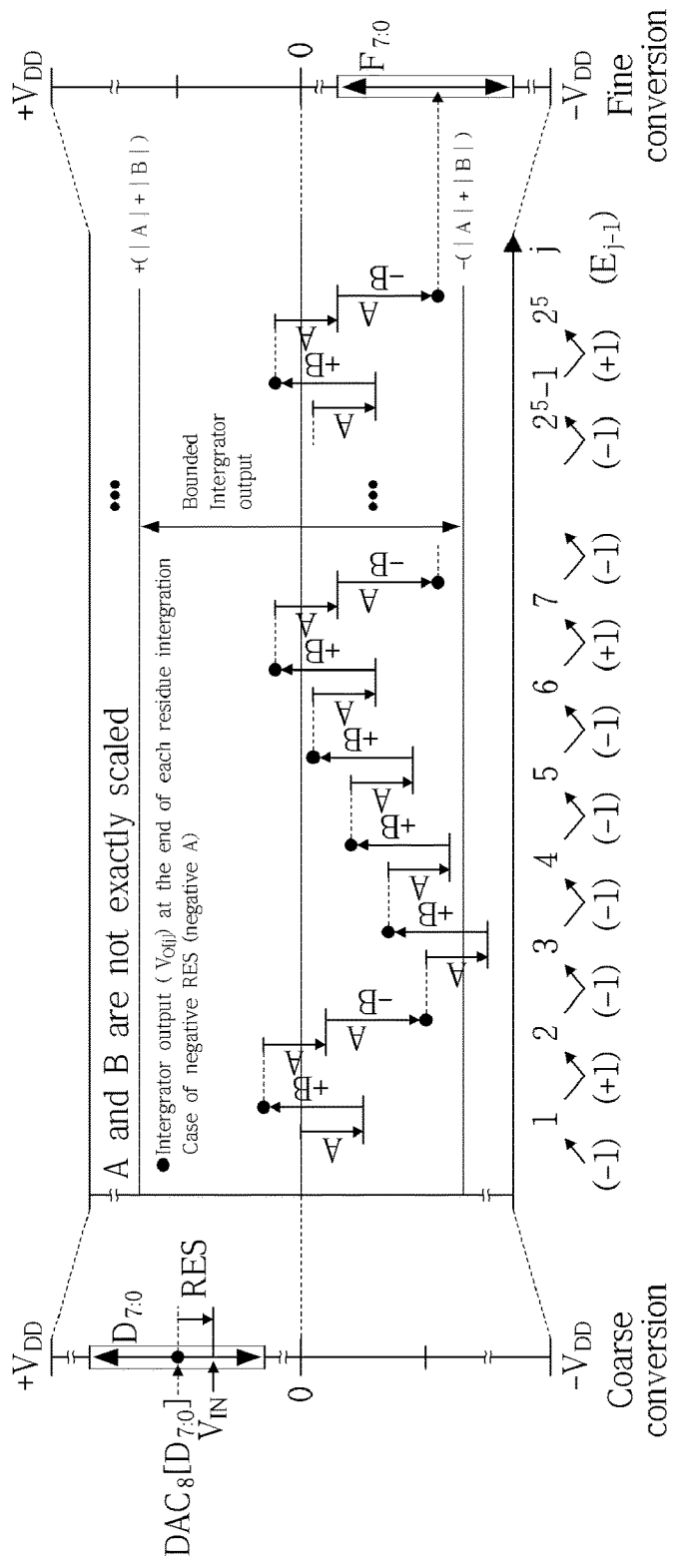
FIG. 2 illustrates the operation principle of the SAR-type ADC according to the embodiment of the present invention.

FIG. 2 illustrates the operation principle of the SAR-type ADC according to the embodiment of the present invention. The operation principle will be described as follows.

When 8-bit coarse SAR conversion for the analog input voltage $V_{IN}$ is completed by the coarse/fine SAR conversion unit 110, the residual voltage RES is represented by ($V_{IN}-DAC_8[D_{7:0}]$).

The residue integration unit 120 accumulates a difference between the feedback voltage $B(=2^{-2} \cdot DAC_1[E_{j-1}])$ of the DSM loop 126 and the result $A(=2^3 \cdot RES)$ obtained by amplifying the residual voltage RES $2^3$ times during the residue integration process, into the integrator 125. Therefore, after the first residue integration process, the output voltage $V_{o[1]}$ of the integrator 125 becomes $2^3 \cdot RES - 2^{-2} \cdot DAC_1[E_0]$. Here, $E_0$ represents the initial value ($E_0=-1$) of the output of the DSM loop 126.

In this way, after the j-th residue integration process, the output voltage $V_{o[j]}$ of the integrator 125 becomes $V_{o[j-1]} + 2^3 \cdot RES - 2^{-2} \cdot DAC_1[E_{j-1}]$. Thus, after all of $2^5$ residue integration processes are completed, the output voltage $V_o[2^5]$ of the integrator 125 becomes $2^8 \cdot RES - 2^{-2} \cdot (DAC_1[E_0] + \ldots + DAC_1[E_{31}])$.

At this time, since a condition of $|2^3 \cdot RES| \le |2^{-2} \cdot DAC_1[E_{j-1}]|$ is satisfied, the output voltage of the integrator 125 by the DSM loop 126 is limited within $\pm(|2^3 \cdot RES| + |2^{-2} \cdot DAC_1 [E_{j-1}]|) = \pm(|A| + |B|)$. When this range is set to the output voltage range which does not cause non-linearity of the amplifier, the residual voltage RES can be amplified $2^8$ times without a distortion caused by the non-linearity.

The final output voltage $V_o[2^5]$ of the integrator 125 is converted into 8 LSBs $F_{7:0}$ through the coarse SAR conversion by the coarse/fine SAR conversion unit 110.

Figure 3:
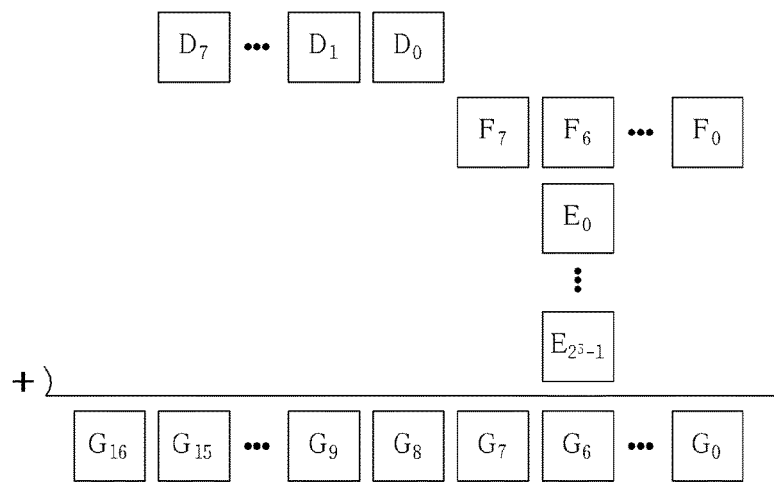
FIG. 3 illustrates the principle that a digital signal output unit generates a final digital output.

FIG. 3 illustrates the principle that the digital signal output unit generates the final digital output. The principle will be described as follows.

The residual voltage RES outputted through the first subtractor 122 is finally amplified $2^8$ times, and $2^5$ comparison results $E_0$ to $E_{31}$ by the comparator 126A of the DAM loop 126 have a weight equal to $F_6$. Therefore, the result $D_{7:0}$ of the coarse SAR conversion, the results $E_0$ to $E_{31}$ of the DSM loop, and the result $F_{7:0}$ of the fine SAR conversion are added up as illustrated in FIG. 3, and the 17-bit digital code $G_{16:0}$ is finally generated. However, since a 1024 code offset is generated, the 16-bit digital code is finally generated by subtracting the offset from the digital code $G_{16:0}$.

Figure 4:
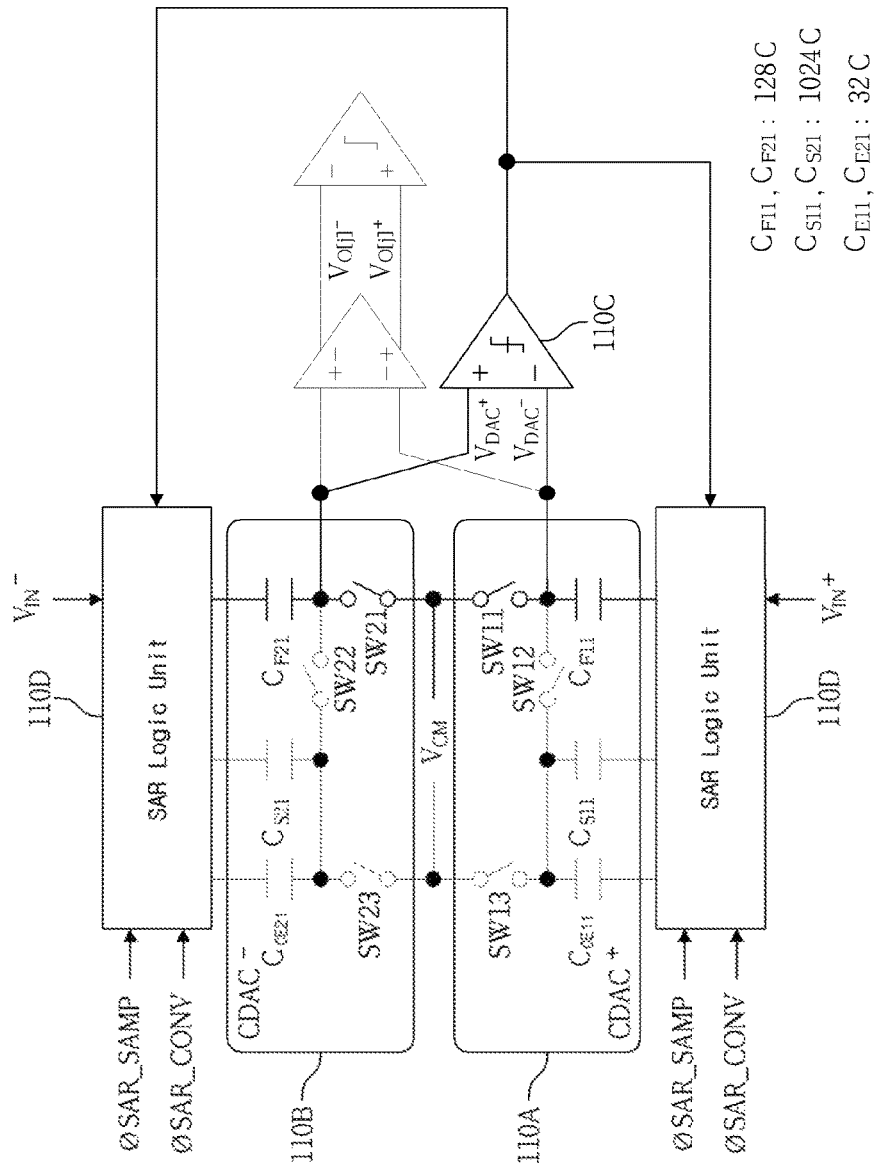
FIG. 4 is a block diagram illustrating coarse/fine conversion logic according to the embodiment of the present invention.

FIG. 4 is a block diagram illustrating the coarse/fine conversion logic according to the embodiment of the present invention. As illustrated in FIG. 4, the coarse/fine conversion logic includes a first capacitive digital-analog converter (CDAC) 110A, a second CDAC 110B, an SAR comparator 110C and an SAR logic unit 110D.

The SAR logic unit 110D of FIG. 4 indicates a part of the functions of the first DAC 121, the first subtractor 122 and the integrator 125 in FIG. 1, a part of the SAR logic unit 110D and capacitors $C_{E11}$ and $C_{E21}$ in FIG. 4 indicate the second subtractor 124 and the second DAC 126C in FIG. 1, and the comparator 110C of FIG. 4 indicates the comparator installed in the ADC 112 of FIG. 1.

The first CDAC 110A includes a residue integration capacitor $C_{F11}$, a residual voltage generation capacitor $C_{S11}$, a capacitor $C_{E11}$ and switches SW11 to SW13. The residue integration capacitor $C_{F11}$ is connected to an input terminal and feedback terminal of a residual voltage amplifier 120C, and used for residue integration. The residual voltage generation capacitor $C_{S11}$ alternately receives the analog input voltage $V_{IN}$ and the coarse SAR conversion result $D_{7:0}$, and generates a residual voltage. The capacitor $C_{E11}$ is charged with a feedback bit $E_j$ supplied from the comparator 120D. The switches SW11 to SW13 switch the capacitors $C_{F11}$, $C_{S11}$ and $C_{E11}$.

The capacitances of the capacitors $C_{F11}$, $C_{S11}$ and $C_{E11}$ are not specifically limited, but the residue integration capacitor $C_{F11}$ has a capacitance of 128 C (C: unit capacitance). For this configuration, the residue integration capacitor $C_{F11}$ may include capacitors with capacitances of 64 C, 32 C, 16 C, 8 C, 4 C, 2 C, 1 C and 1 C. The residual voltage generation capacitor $C_{S11}$ may have a capacitance of 1024 C, and the capacitor $C_{E11}$ may have a capacitance of 32 C. In the present embodiment, however, the first CDAC 110A converts the analog input voltage $V_{IN}$ into the MSB digital signal $D_{7:0}$ using the residue integration capacitor $C_{F11}$ having a relatively small capacitance in the coarse SAR conversion mode and the fine SAR conversion mode. Therefore, the analog-digital conversion can be performed at higher speed.

The second CDAC 110B has the same internal configuration as the first CDAC 110A. However, the digital signal $D_{7:0}$ inputted to the second CDAC 110B and the feedback bit $E_{j-1}$ inputted through the delay 120E have the opposite signs.

The switches SW11 and SW21 are turned on to use the residue integration capacitors $C_{F11}$ and $C_{F21}$ during the coarse/fine SAR conversion as well as the residue integration. At first, a voltage inputted from outside is stored in the residue integration capacitors $C_{F11}$ and $C_{F21}$ through the switches SW11 and SW21, and subjected to coarse SAR conversion. Then, a voltage which is finally acquired after the residue integration is stored in the residue integration capacitors $CF_{11}$ and $C_{F21}$. Therefore, the finally acquired voltage is used to perform the fine SAR conversion. The switches SW11 to SW13 of the first CDAC 110A and the switches SW21 to SW23 of the second CDAC 110B perform the functions of the multiplexer 111 and the demultiplexer 113 in FIG. 1.

When receiving a sampling prediction signal $\Phi_{SAR\_SAMP}$ generated by a clock signal which is inputted to notice that an analog input voltage is supplied for the first time, the SAR logic unit 110D supplies a positive analog input voltage $V_{IN}^+$ to the residue integration capacitor $C_{F11}$ of the first CDAC 110A. At this time, the SAR logic unit 110D turns on the switches SW11 and SW21 to charge the capacitors $C_{S11}$ and $C_{E11}$ with a voltage difference between the analog input voltage $V_{IN}^+$ and a common mode voltage $V_{CM}$.

The charging control operation for the capacitors $C_{F11}$, $C_{S11}$ and $C_{E11}$ of the first CDAC 110A through the SAR logic unit 110D is performed in a similar manner on the capacitors $C_{F21}$, $C_{S21}$ and $C_{E21}$ of the second CDAC 110B, and a difference therebetween is that a negative analog input voltage $V_{IN}^-$ is supplied to the capacitors $C_{F21}$, $C_{s21}$ and $C_{E21}$ of the second CDAC 110B.

When receiving a conversion prediction signal $\Phi_{SAR\_CONV}$ for informing the SAR logic unit 110D that the capacitors $C_{F11}$, $C_{S11}$ and $C_{E11}$ are completely charged after a predetermined time has elapsed, the SAR logic unit 110D turns off the switch SW13 to block the negative analog input voltage $V_{IN}^+$ supplied to the residue integration capacitor $C_{F11}$. The conversion prediction signal $\Phi_{SAR\_CONV}$ is generated by the SAR logic unit 110D after the sampling operation is completed.

Then, the SAR comparator 110C compares a negative residual voltage $V_{DAC}^-$ supplied from the first CDAC 110A to a positive residual voltage $V_{DAC}^+$ supplied from the second CDAC 118B, and outputs a resultant comparison signal CS.

The SAR logic unit 110D decides a charge voltage of the capacitor of 64C installed in the residue integration capacitor $C_{F11}$ according to the comparison signal CS supplied from the SAR comparator 110C, and the charge voltage corresponds to the first bit value of the analog-digital conversion.

Then, the SAR logic unit 110D decides charge voltages of the other capacitors of 32 C, 16 C, 8 C, 4 C, 2 C, 1 C and 1 C by repeatedly performing the above operation on the other bits. Through a total of eight analog-digital conversion operations, the 8-bit SAR conversion is completed.

Figure 5:
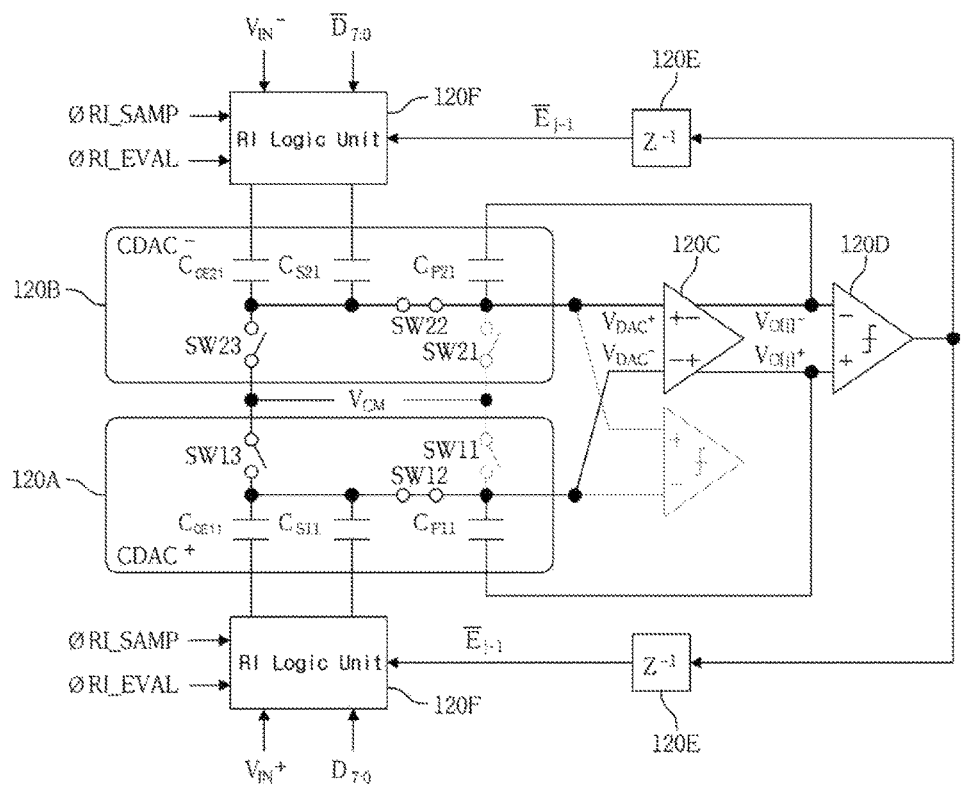
FIG. 5 is a block diagram illustrating residue integration logic according to the embodiment of the present invention.

FIG. 5 is a block diagram illustrating the residue integration logic according to the embodiment of the present invention. As illustrated in FIG. 5, the residue integration logic includes a first CDAC 120A, a second CDAC 120B, a residual voltage amplifier 120C, a residual voltage comparator 120D, a delay 120E, a residue integration (RI) logic unit 120F.

The residual voltage amplifier 120C of FIG. 5 indicates the residual voltage amplifier 123 of FIG. 1, the RI logic unit 120F of FIG. 5 indicates the first DAC 121, the first subtractor 122 and the integrator 125 in FIG. 1, a part of the RI logic unit 120F and capacitors $C_{E11}$ and $C_{E21}$ in FIG. 5 indicate the second subtractor 124 and the second DAC 126C in FIG. 1, the comparator 120D of FIG. 5 indicates the comparator 126A of FIG. 1, the delay 120E of FIG. 5 indicates the delay 126B of FIG. 1, and the ratio of the capacitor $C_{E11}$ to the capacitor $C_{F11}$ and the ratio of the capacitor $C_{E21}$ to the capacitor $C_{F21}$ in FIG. 5 indicate the amplifier 126D of FIG. 1.

The first CDAC 120A includes capacitors $C_{F11}$, $C_{S11}$ and $C_{E11}$ for storing voltages and switches SW11 to SW13 for switching the capacitors $C_{F11}$, $C_{S11}$ and $C_{E11}$. The capacitor $C_{E11}$ for a feedback bit has a capacitance of 32C. The total capacitance of the residual voltage generation capacitor $C_{S11}$ is 1024 C. For this configuration, the residual voltage generation capacitor $C_{S11}$ includes capacitors with capacitances of 512 C, 256 C, 128 C, 64 C, 32 C, 16 C, 8 C, 4 C and 4 C.

The second CDAC 120B has the same internal configuration as the first CDAC 120A.

The RI logic unit 120F controls the first CDAC 120A to generate a negative residual voltage $V_{DAC}^-$, and the negative residual voltage $V_{DAC}^-$ is supplied to one input terminal of the residual voltage amplifier 120C.

In order to notify that an analog input voltage is supplied after SAR conversion is completed by the coarse/fine SAR conversion unit 110, a sampling prediction signal $\Phi_{RI\_SAMP}$ is inputted to the RI logic unit 120F. At this time, the RI logic unit 120F supplies the positive analog input voltage $V_{IN}^+$ to one terminals of the capacitors $C_{S11}$ and $C_{E11}$, and turns on the switch SW13 to charge the capacitors $C_{S11}$ and $C_{E11}$ with the common mode voltage $V_{CM}$.

When the charging operation for the capacitors $C_{S11}$ and $C_{E11}$ is completed, a residual voltage measurement signal $\Phi_{RI\_EVAL}$ is inputted to the RI logic unit 120F. At this time, the RI logic unit 120F turns off the switch SW13 to block the common mode voltage VCM supplied to the capacitors $C_{S11}$ and $C_{E11}$. At this time, the residual voltage amplifier 120C is switched to an enable state.

The residue integration capacitors $C_{F11}$ and $C_{F21}$ which have been used for SAR conversion are connected to both input terminals of the residual voltage amplifier 120C, such that their charge voltages are amplified by the residual voltage amplifier 120C.

The RI logic unit 120F turns on the switch SW12 to sequentially supply the SAR 8-bit voltage converted in the previous mode to one input terminal of the residual voltage amplifier 120C, and the previously generated feedback bit $E_{j-1}$ is stored the capacitor CE11 through the delay 120E such that the negative residual voltage $V_{DAC}^-$ is generated from the first CDAC 120A. The negative residual voltage $V_{DAC}^-$ is supplied to the one terminal of the residual voltage amplifier 120C.

Similarly, the RI logic unit 120F controls the second CDAC 120B in the same manner as the first CDAC 120A, such that a positive residual voltage $V_{DAC}^+$ is generated from the second CDAC 120B. The positive residual voltage $V_{DAC}^+$ is supplied to the other input terminal of the residual voltage amplifier 120C.

The residual voltages $V_{DAC}^-$ and $V_{DAC}^+$ generated through the above-described processes are converted into voltages $V_{o[j]}^-$ and $V_{o[j]}^+$ amplified by $2^3$ through the residual voltage amplifier 120C.

The comparator 120D compares the generated voltages $V_{o[j]}^-$ and $V_{o[j]}^+$, and outputs a resultant feedback bit $E_j$.

Such a process is repeated $2^5$ times to adjust the total gain to $2^8$. The voltages $V_{o[j]}^-$ and $V_{o[j]}^+$ generated at the final 32nd ($2^5$) round are supplied as input voltages when the coarse/fine SAR conversion unit 110 is operated in the fine conversion mode.

Figure 6:
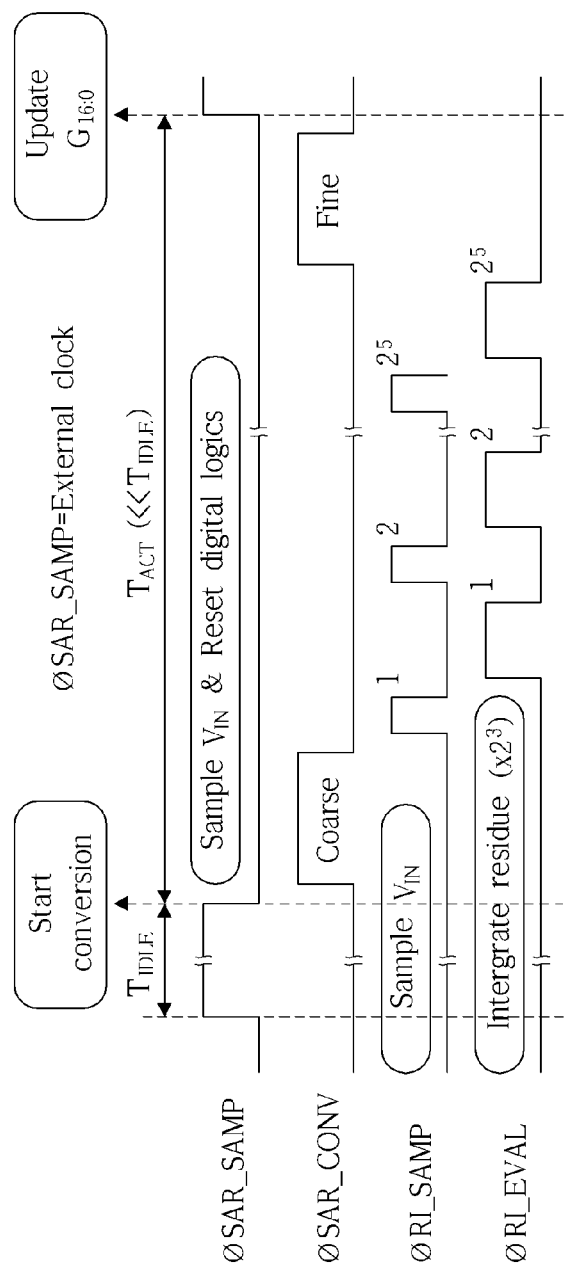
FIG. 6 is a waveform diagram illustrating clock signals applied to the SAR-type ADC using residue integration according to the embodiment of the present invention.

FIG. 6 is a waveform diagram illustrating clock signals applied to the SAR-type ADC using residue integration according to the embodiment of the present invention. The clock signals will be described as follows.

Timing clock signals for analog-digital conversion are internally generated by the sampling prediction signal $\Phi_{SAR\_SAMP}$ which is an external clock signal. When the sampling prediction signal $\Phi_{SAR\_SAMP}$ is "high", the analog input voltage $V_{IN}$ stored in the residue integration capacitors $C_{F11}$ and $C_{F21}$ is sampled, and the digital circuits are reset.

When the sampling prediction signal $\Phi_{SAR\_SAMP}$ transitions to "low", the conversion prediction signal $\Phi_{SAR\_CONV}$ transitions to "high", and the 8-bit coarse SAR conversion is performed.

Then, when the conversion prediction signal $\Phi_{SAR\_CONV}$ transitions to "low", $2^5$ residue integration processes are performed while the sampling prediction signal $\Phi_{RI\_SAMP}$ and the residual voltage measurement signal $\Phi_{RI\_EVAL}$ are alternately activated.

When the series of residue integration processes are finished, the conversion prediction signal $\Phi_{SAR\_CONV}$ transitions to "high" to perform the 8-bit fine SAR conversion. Then, the entire procedure is ended.

The digital output $G_{16:0}$ generated through the above-described procedure is stored in an output register (not illustrated) when the sampling prediction signal $\Phi_{SAR\_SAMP}$ transitions from "low" to "high".

Figure 7:
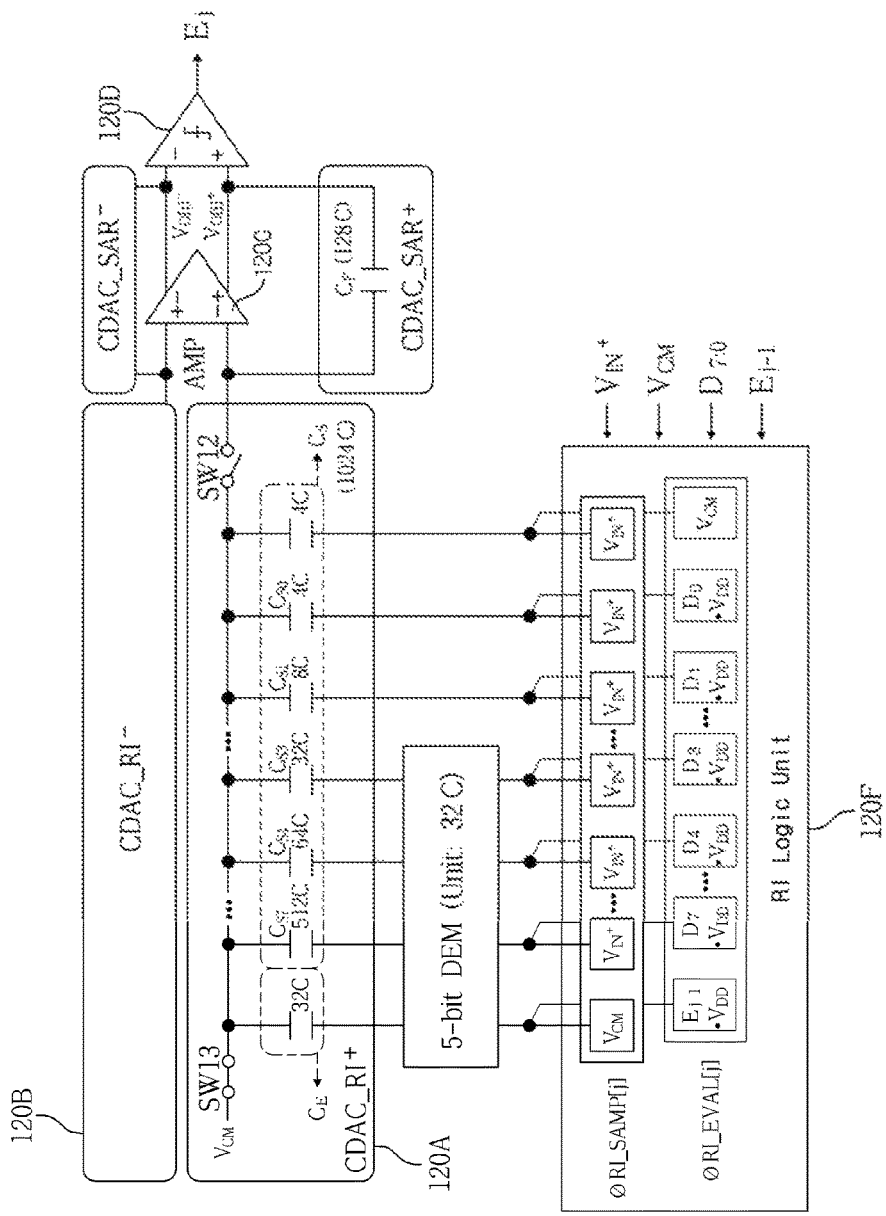
FIG. 7 illustrates an example in which capacitor mismatch is removed according to the embodiment of the present invention.

FIG. 7 is a block diagram illustrating an example in which capacitor mismatch is removed according to the embodiment of the present invention. During the residue integration process, a capacitor mismatch problem may occur. FIG. 7 illustrates that dynamic element matching (DEM) is applied to the residual voltage generation capacitor $C_S$ and the capacitor $C_E$ used for storing a feedback voltage during the residue integration process, in order to remove capacitor mismatch.

During the residue integration process, the capacitors with a total capacitance of 1024 C (32 C×32) are used. At this time, the capacitor $C_E$ used to store a feedback voltage is used for the MSB 32 C, and the residual voltage generation capacitor $C_S$ used to store a 8-bit coarse (or fine) SAR conversion value for the analog input voltage $V_{IN}$ is used for the rest 992 C. The rest 992 C is classified into 31 capacitors with a capacitance of 32 C, or specifically, 16 capacitors $C_{S7}$ (512 C), eight capacitors $C_{S6}$ (256 C), four capacitors $C_{S5}$ (128 C), two capacitors $C_{S4}$ (64 C) and one capacitor $C_{S3}$ (32 C).

As described above, the process of storing a voltage corresponding to the same digital signal excluding the feedback bit at the step of generating the residual voltage RES by charging a capacitor with an analog signal converted from a digital signal is repeatedly performed 32($2^5$) times, when the residual voltage measurement signal $\Phi_{RI\_EVAL}$ is inputted. At this time, the capacitors with a capacitance of 32 C among the capacitors with a total capacitance of 1024 C are sequentially selected 32 times to store a voltage corresponding to the digital signal. Therefore, the top five capacitors $C_{S7}$ to $C_{S3}$ and the capacitor $C_E$ may be averaged to remove capacitor mismatch.

Figure 8:
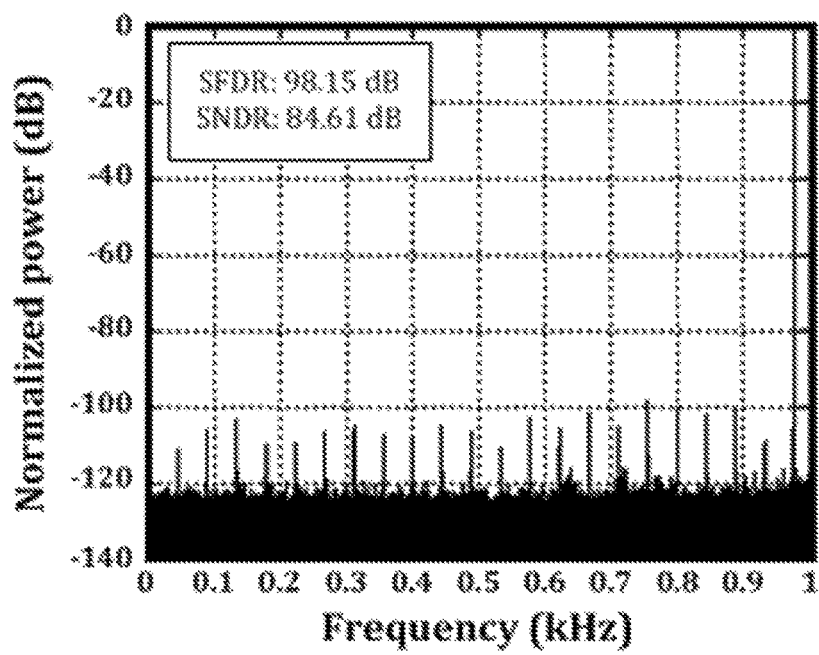
FIG. 8 is a graph illustrating a Nyquist speed FFT spectrum of the SAR-type ADC according to the embodiment of the present invention.

FIG. 8 is a graph illustrating a Nyquist speed FFT (Fast Fourier Transform) spectrum of the SAR-type ADC according to the embodiment of the present invention. When the SAR-type ADC according to the embodiment of the present invention converts an analog signal of 977.777 Hz at a sampling speed of 2 KS/s as illustrated in FIG. 8, a spurious free dynamic range (SFDR) of 98.2 dB and a signal-to-noise ratio and distortion ratio (SNDR) of 84.6 dB are exhibited.

Figure 9:
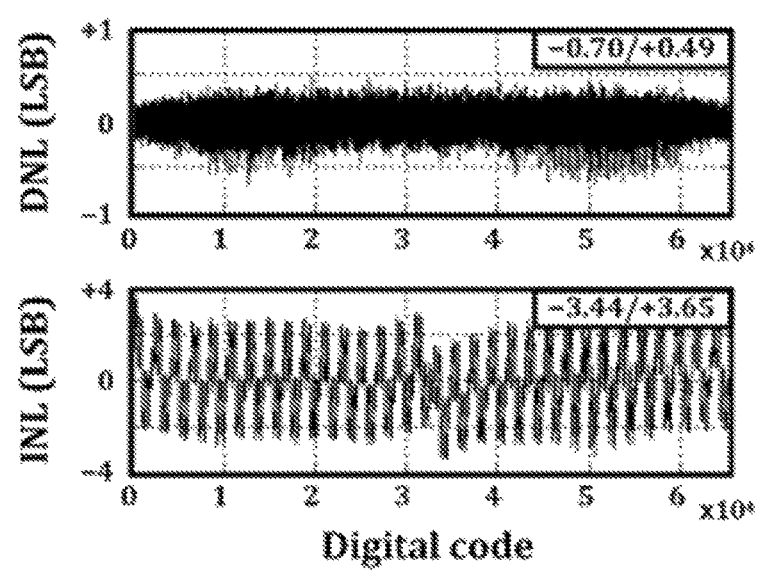
FIG. 9 is a waveform diagram illustrating the linear characteristic of the SAR-type ADC according to the embodiment of the present invention.

FIG. 9 is a waveform diagram illustrating the linear characteristic of the SAR-type ADC according to the embodiment of the present invention. As illustrated in FIG. 9, the SAR-type ADC according to the embodiment of the present invention exhibits a differential non-linearity (DNL) of −0.70/+0.49 and an integral non-linearity (INL) of −3.44/+3.65 at a sampling speed of 2 KS/s.

According to the embodiment of the present invention, the SAR-type ADC can amplify a residual voltage without a non-linearity problem caused by an output voltage of the residual voltage amplifier, thereby performing high-resolution analog-digital conversion at low power consumption.

While various embodiments have been described above, it will be understood to those skilled in the art that the embodiments described are by way of example only. Accordingly, the disclosure described herein should not be limited based on the described embodiments.

What is claimed is:

1. A successive approximation register (SAR)-type analog-digital converter (ADC) using residue integration, comprising:
    a coarse/fine SAR conversion unit configured to receive an analog input voltage and convert the received voltage into an MSB digital signal in a coarse SAR conversion mode, and receive a feedback voltage and convert the received voltage into an LSB digital signal in a fine SAR conversion mode;
    a residue integration unit configured to repeatedly amplify a residual voltage with a predetermined gain by a predetermined number of times and output the amplified voltage as a final target multiple, the residual voltage corresponding to a voltage difference between the analog input voltage and an analog voltage obtained by converting the digital signal into an analog signal; and
    a digital signal output unit configured to add up a coarse SAR conversion result supplied from the coarse/fine SAR conversion unit, a result of a delta-signal modulation (DSM) loop installed in the residue integration unit, and a fine SAR conversion result supplied from the coarse/fine SAR conversion unit, and output a digital code of the corresponding bit.

2. The SAR-type ADC of claim 1, wherein the coarse/fine SAR conversion unit comprises:
    a multiplexer configured to configured to select and output the analog input voltage in the coarse SAR conversion mode, and select and output the feedback in the fine SAR conversion mode;
    an ADC configured to convert the analog signal supplied from the multiplexer into a digital signal in the coarse SAR conversion mode or the fine SAR conversion mode;
    a demultiplexer configured to output the MSB digital signal in the coarse SAR conversion mode or output the LSB digital signal in the fine SAR conversion mode, when outputting the digital signal supplied from the ADC; and
    a control logic unit configured to control the operations of the multiplexer and the demultiplexer according to the coarse SAR conversion mode and the fine SAR conversion mode.

3. The SAR-type ADC of claim 1, wherein the residue integration unit repeatedly amplifies the residual voltage with a gain of $2^3$ by $2^5$ times, and finally outputs a voltage which is $2^8$ times higher than the residue voltage.

4. The SAR-type ADC of claim 1, wherein the residue integration unit comprises:
    a first digital-analog converter (DAC) configured to convert the MSB digital signal supplied from the coarse/fine SAR conversion unit into an analog signal;
    a first subtractor configured to subtract an output voltage of the first DAC from the input voltage, and output the resultant residual voltage;
    a residual voltage amplifier configured to amplify the residual voltage with a preset multiple;
    a second subtractor configured to subtract a DSM feedback voltage from an output voltage of the residual voltage amplifier;
    an integrator configured to integrate an output voltage of the second subtractor and generate the resultant output voltage; and
    a DSM loop configured to generate the DSM feedback voltage whenever the residual voltage is amplified with the preset multiple and accumulated in the integrator, and limit the output voltage of the integrator within an output voltage range which does not cause non-linearity of the residual voltage amplifier.

5. The SAR-type ADC of claim 4, wherein the preset multiple is $2^3$.

6. The SAR-type ADC of claim 4, wherein the number of times that the residual voltage is amplified with the preset multiple and accumulated in the integrator is set to $2^5$.

7. The SAR-type ADC of claim 4, wherein the DSM loop comprises:
    a comparator configured to compare the output voltage of the integrator to a reference voltage, and generate a resultant digital feedback voltage;
    a delay configured to delay the digital feedback voltage supplied from the comparator;
    a second DAC configured to convert the digital feedback voltage outputted from the delay into an analog signal; and
    an amplifier configured to generate the DSM feedback voltage by amplifying the analog voltage supplied from the second DAC.

8. The SAR-type ADC of claim 7, wherein the comparator comprises a 1-bit comparator, and the second DAC comprises a 1-bit DAC.

9. The SAR-type ADC of claim 7, wherein the amplifier amplifies the analog voltage supplied from the second DAC with a multiple of $2^{-2}$.

10. The SAR-type ADC of claim 1, wherein the coarse/fine SAR conversion unit comprises:
    a residue integration capacitor configured to perform a charging operation for the residue integration;
    a residual voltage generation capacitor configured to alternately receive the analog input voltage and the result of the coarse SAR conversion, and generate a residual voltage; and
    first and second capacitive digital-analog converters (CDAC) each comprising a feedback voltage charging capacitor for storing a feedback voltage supplied from the residue integration unit.

11. The SAR-type ADC of claim 10, wherein the residue integration capacitor is designed to have a smaller value than the capacitance of the residual voltage generation capacitor or the feedback voltage charging capacitor, such that the feedback voltage is converted into the LSB digital signal at a relatively high speed in the coarse SAR conversion mode.

12. The SAR-type ADC of claim 10, wherein the residue integration capacitor is designed to have a smaller value than the capacitance of the residual voltage generation capacitor or the feedback voltage charging capacitor, such that the residual voltage amplified after the residue integration is converted into the LSB digital signal at a relatively high speed in the fine SAR conversion mode.

13. The SAR-type ADC of claim 10, wherein dynamic element matching (DEM) is applied to the feedback voltage charging capacitor and the residual voltage generation capacitor, in order to remove capacitor mismatch.

* * * * *